United States Patent [19]

Ponewash

[11] Patent Number: 5,782,993
[45] Date of Patent: Jul. 21, 1998

[54] PHOTOVOLTAIC CELLS HAVING MICRO-EMBOSSED OPTICAL ENHANCING STRUCTURES

[76] Inventor: Jackie Ponewash, P.O. Box 1196, Kapaa, Hi. 96746

[21] Appl. No.: 671,768

[22] Filed: Jun. 28, 1996

Related U.S. Application Data

[60] Provisional application No. 60/000,625 Jun. 30, 1995.

[51] Int. Cl.$^6$ .............................................. H01L 31/048
[52] U.S. Cl. .......................... 136/251; 136/246; 136/256; 136/259
[58] Field of Search .................................. 136/246, 257, 136/259, 256, 245

[56] References Cited

U.S. PATENT DOCUMENTS

| | | | |
|---|---|---|---|
| 4,816,324 | 3/1989 | Berman | 428/216 |
| 4,888,061 | 12/1989 | Wenz | 136/251 |
| 5,273,608 | 12/1993 | Nath | 156/301 |
| 5,356,656 | 10/1994 | Kuo et al. | 427/58 |
| 5,605,769 | 2/1997 | Toms | 429/9 |

*Primary Examiner*—Nam Nguyen
*Attorney, Agent, or Firm*—Brad Pedersen

[57] ABSTRACT

A photovoltaic device has micro-embossed optical enhancing structures formed on an inner surface of a transparent polymer film material which is laminated to the light incident surface of a photovoltaic cell. Preferably, the micro-embossed structures are in the form of an array of holographic pyramid structures which are interconnected by a series of light channels that are also embossed on the inner surface of transparent film material. In another embodiment, the photovoltaic device is comprised of a layer of flexible transparent polymer material, such as polyester, and a layer of flexible base substrate, preferably of a polymer film, between which are disposed at least one layer of amorphous silicon and at least one layer of metalization forming a photovoltaic cell. By utilizing a pair of flexible sheets of polymer material as the outer layers of the photovoltaic device, the device is deformable in at least one orientation other than a plane defining the sheets of polymer film material.

5 Claims, 2 Drawing Sheets

PHOTOVOLTAIC CELLS HAVING MICRO-EMBOSSED OPTICAL ENHANCING STRUCTURES

RELATED APPLICATION

This application is based on a provisional application, Ser. No. 60/000,625, filed Jun. 30, 1995, and claims priority thereto.

FIELD OF THE INVENTION

The present invention relates to devices comprising photovoltaic cells and the manufacture thereof. More particularly, the present invention relates to a photovoltaic device having micro-embossed optical enhancing structures on an inner surface of a transparent polymer film material so as to increase the efficiency of operation of the photovoltaic cell and to a photovoltaic device having a pair of flexible sheets of polymer material as the outer layers of the photovoltaic cell such that the device is deformable in at least one orientation other than a plane defining the sheets of polymer material.

BACKGROUND OF THE INVENTION

Photovoltaic cells are well-known in the art. Also know in the art of photovoltaic cells are the use of optical enhancers, such as prisms, parabolic mirrors and the like, to increase the collection efficiency of such photovoltaic cells. Several problems, however, have prevented the widespread use of photovoltaic cells as convenient and economical sources for collecting solar energy.

Traditionally, photovoltaic cells have required some form of fixed substrate, such as glass or the like, which requires that the photovoltaic cells be constructed essentially as planar, rigid sheets of material. This has limited the manner and location in which photovoltaic cells can be utilized.

Second, the collection efficiency of conventional solar photovoltaic cells is relatively low, on the order of 5-15% of the total available energy impinging upon the photovoltaic cell. Although efforts have been undertaken to improve the efficiency, both in terms of intrinsic operation of the photovoltaic cell and in terms of optical concentrators, such as prisms and mirrors to focus and concentrate the optical energy impinging on the photovoltaic cell, significant increases in efficiency have not been realized.

Finally, production costs of conventional photovoltaic cells have been such that application of the principles of economy of scale have generally not been possible. As a result, photovoltaic cells have not been perceived as an economically viable energy source for large scale energy needs.

It would be desirable to provide for a photovoltaic device which could overcome these disadvantages and which could provide for other advantages in construction and operation.

SUMMARY OF THE INVENTION

The present invention provides for a photovoltaic device having micro-embossed optical enhancing structures formed on an inner surface of a polymer film material which is laminated to a photovoltaic cell. Preferably, the micro-embossed structures are in the form of an array of holographic pyramidal structures which are interconnected by a series of light channels that are also embossed on the inner surface of the polymer film material. In another embodiment, the photovoltaic device is comprised of a layer of transparent polymer material, such as a polyester, and a layer of flexible base substrate, preferably a polymer film, between which are disposed at least one layer of amorphous silicon and at least one layer of metalization, together forming a photovoltaic cell. By utilizing a pair of sheets of flexible polymer material as the outer layers of the photovoltaic device, the device is deformable in at least one orientation other than a plane defining the sheets of polymer film material.

The photovoltaic device of the present invention is advantageous for a number of reasons. First, the flexible characteristics of the preferred embodiment constructed of laminated polymer film layers allows the photovoltaic device to be laminated or otherwise adhered to the exterior surfaces of a wide variety of structures and building materials, such that the dwellings created therefrom can provide both shelter and electrical energy to the inhabitants. In such an embodiment, the present invention can be coordinated with a battery system or other energy storage system so as to provide for continuous energy supply, even when there is no source of ambient light. Second, the optical enhancement structure significantly increases the collection efficiency of the photovoltaic cell without the need for additional separate optical structures, such a parabolic mirrors or prisms. Third, the film-based nature of the photovoltaic device of the present invention allows for web manufacturing techniques to be applied in the production of the photovoltaic device on a large scale.

DETAILED DESCRIPTION OF THE PREFERRED EMBODIMENT

Figure 1:
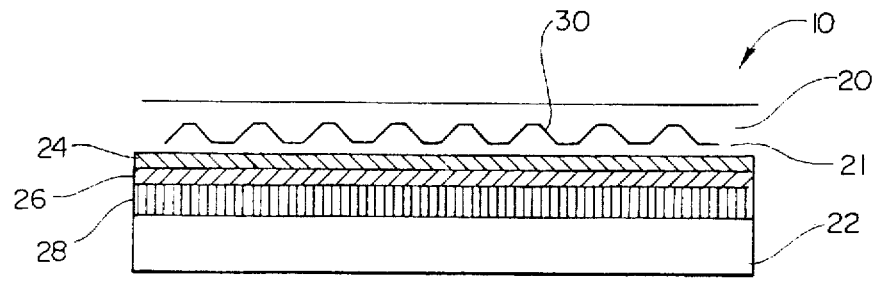
FIG. 1 is a cross-sectional view of a preferred embodiment of the photovoltaic device of the present invention.

Referring to FIG. 1, a cross-sectional view of a photovoltaic device 10 in accordance with the present invention is shown. The photovoltaic device 10 preferably includes a firs touter layer 20 and a second outer layer 22. In order to provide for flexibility of the photovoltaic device 10, layers 20, 22 are preferably comprised of a polymer film material, such a polyester or Mylar®. Alternatively, base layer 22 could be comprised of other web or web-like materials such as Tyvek®. Between outer layers 20, 22 are disposed one or more photovoltaic layers of amorphous silicon 24, 26 and at least one layer of metalization 28 as required to form a functioning photovoltaic cell. In a preferred embodiment, silicon layers 24, 26 and metalization layers 28 are deposited upon base layer 22 by sputtering or other thin film deposition techniques, or by chemical surface alteration techniques. It will be apparent to a person skilled in the art that numerous variations can be make with respect to the composition of silicon layers 24, 26 and metalization layer 28. For example, it is possible to coat a bottom side of metalization layer 28 with paint-like material so as to increase the reflective quality of base layer 22, thereby providing for increased absorption of photonic energy by silicon layers 24, 26. It is also possible to include multiple metalization layers 28 so as to form multiple photovoltaic cells which are electrically interconnected in a variety of patterns.

Figure 2:
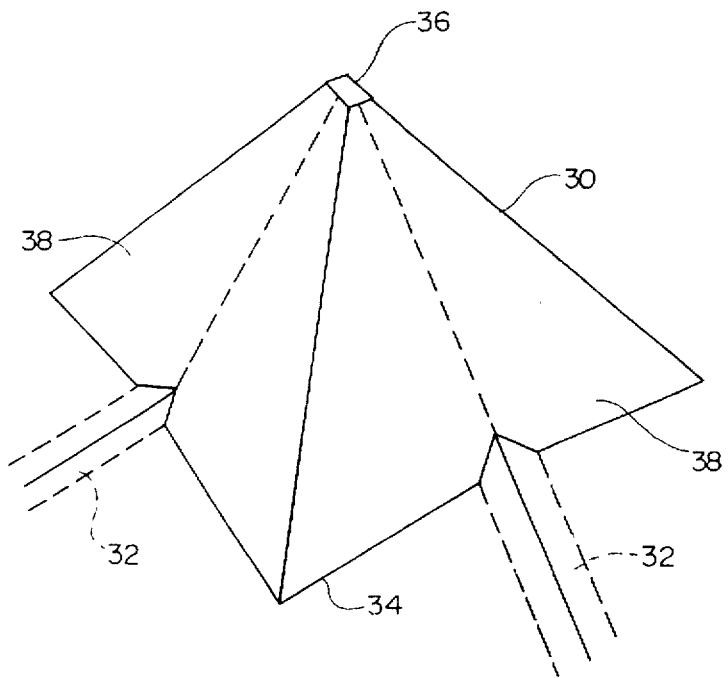
FIG. 2 is a perspective elevation of one of the holographic structures embossed on a surface of the photovoltaic device shown in FIG. 1.

Outer layer 20 includes a plurality of micro-embossed optical enhancement structures 30 which serve to concentrate and intensify the optical energy, thereby enhancing the photovoltaic function of layers 24, 26 and 28. In addition, a plurality of wave guide channel structures 32 (as shown in FIG. 2) may be provided to interconnect the enhancing structures 30 so as to form a grid network of embossed structures on an inner surface of layer 20. It is preferred that optical enhancing structures 30 are formed on an inner surface 21 of outer layer 20 so as to present a smooth exterior surface and reduce the possibility of debris collecting and potentially damaging enhancing structures 30, although the present invention may work in certain applications by having optical enhancing structures 30 micro-embossed on an exterior surface of outer layer 20.

Referring now to FIG. 2, a perspective elevation of a preferred embodiment of optical enhancing structure 30 is shown. In the preferred embodiment, optical enhancing structure 30 is a pyramid in design which is micro-embossed on the inner surface 21 of outer layer 20. In a preferred embodiment, the channels 32 are also embossed on the inner surface 21 and extend from the centerpoints of each of the sides of pyramid 30 at the base 34 of the pyramid. Preferably, a flat square or rectangular surface 36 is embossed on the top of pyramid structure 30. Each side 38 of pyramid 30 is preferably formed of two equilateral triangles which are slightly canted inward to form a concave surface on sides 38. In a preferred embodiment, the angle of the slope of sides 38 to base 34 preferably ranges form about 30° to 60°, and is optimally 51°, 51°. The ratio of the length of the base of side 34 to the height of the pyramid 30 preferably ranges from about 4:1 to about 1:1 and is optimally $\pi/2$. The angle of the inward cant of each side 34 is less than 10° and is optimally 0.45°.

The specific details of the techniques for embossing enhancing structure 30 on a thin film material, such a polymer web of 1–10 mils thickness, are similar to the techniques which are currently utilized to produce holographic images, such as the techniques utilized by Flexcon Corporation of Massachusetts, and described, for example, in U.S. Pat. No. 5,296,949, the disclosure of which is hereby incorporated by reference.

Figure 3:
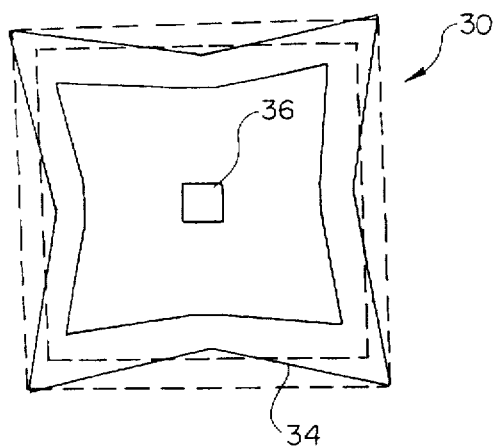
FIG. 3 is a top perspective of a base line drawing of the holographic structure shown in FIG. 2.

FIG. 3 shows a top perspective of a hologram base line drawing of a preferred embodiment of the micro-embossed pyramid 30 of the present invention.

Figure 4:
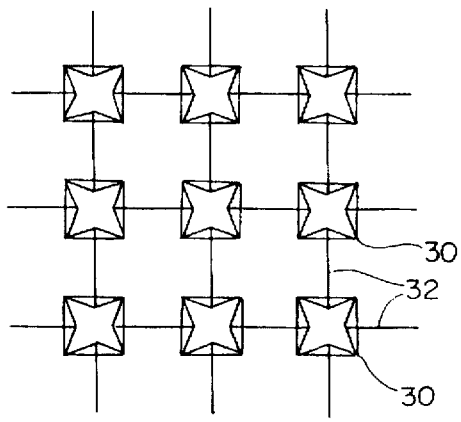
FIG. 4 is a first embodiment of an embossing grid pattern in accordance with the present invention.

FIG. 4 shows an embossing grid pattern in which eight channels 32 are interconnected between adjacent pyramid structures 30 so as to form a rectangular grid structure.

Figure 5:
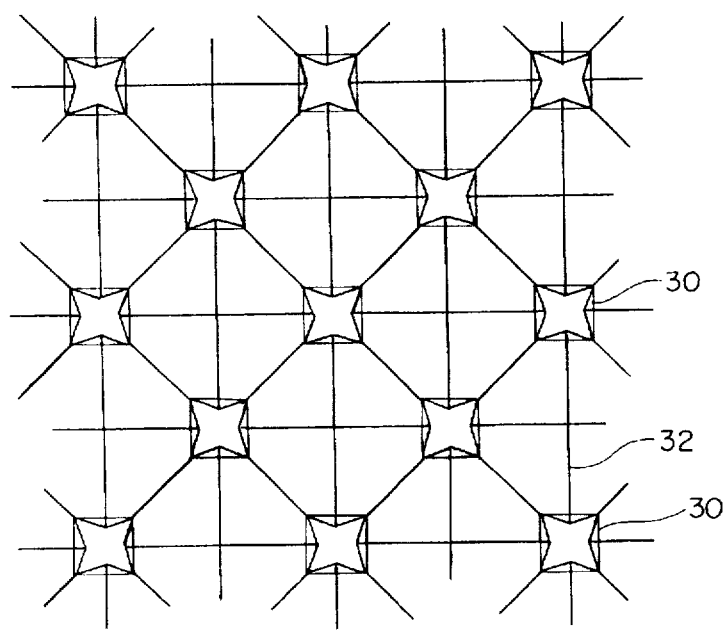
FIG. 5 is an alternate embodiment of an embossing grid pattern in accordance with the present invention.

FIG. 5 shows an alternate embossing grid pattern in which each channels 32 are connected to each pyramid structure 30 so as to double the number of interconnections among pyramid structures 30 as compared to the embossing grid pattern shown in FIG. 4.

In a preferred embodiment, optical enhancing structures 30 each have a surface area of less than 1 mm$^2$, and preferably less than 0.5 mm$^2$. In a grid pattern embodiment, optical enhancing structures 30 are preferably separated by a distance of less than 1 mm. In the embodiment using pyramid structures 30, it is possible that bases 34 of adjacent pyramid structures can be abutting one another. Preferably optical enhancing structures 30 are micro-embossed on the interior surface 21 of outer layer 20 at a depth of no more than ¾ of the depth of outer layer 20 as to allow outer layer 20 to retain the tensile strength necessary to prevent breaking or tearing when flexed.

It will be sen that the fact that the photovoltaic material 10 is comprised of a pair of polymer film materials allows the photovoltaic cells of the present invention to be provided with a certain degree of flexibility in accordance with the general flexibility and deformability of the polymer materials themselves. It would be noted that the embossed structures 30, 32, due to the fact that they are embossed in the outer film layer 20, will substantially retain their geometrical shape, even which material 10 is configured in a non-planar orientation. Although it is desirable minimize the number of layers of photovoltaic device 10 in order to keep the overall weight of the material to a minimum, it would be possible to laminate other transparent protective layers or supporting base layers on top of outside layers 20, 22, respectively.

In an alternate embodiment of the present invention, outer layer 20 including optical enhancing structures 30 is laminated onto a conventional rigid photovoltaic cell. While this embodiment does not benefit from the flexibility of the preferred embodiment, the increased efficiency and each of web manufacturing of outer layer 20 may benefit the production of such conventional rigid photovoltaic cells.

Further disclosure and background of the present invention I described in the disclosure document 3348838 filed with the Department of Commerce on Jul. 9, 1993.

What is claimed is:

1. A photovoltaic device comprising:
   a photovoltaic cell having at least one light incident surface; and
   a layer of transparent polymer film material having a plurality of optical enhancing structures micro-embossed on an inner surface thereof which is layered in optical connection with the light incident surface of photovoltaic cell.

2. The photovoltaic device of claim 1 wherein the optical enhancing structure comprise:
   a grid of holographic pyramidal structures; and
   a plurality of channel structures interconnecting multiple ones of the pyramidal structures.

3. The photovoltaic device of claim 2 wherein the pyramidal structures include a flat top and four sides, each of the sides forming a concave surface comprised of a pair of equilateral triangles.

4. The photovoltaic device of claim 1 wherein each of the optical enhancing structures occupies no more than 1 mm$^2$ of surface area of the transparent polymer film.

5. The photovoltaic device of claim 1 wherein the transparent polymer film is a transparent polyester.

* * * * *